(12) United States Patent
Read et al.

(10) Patent No.: US 9,754,896 B2
(45) Date of Patent: *Sep. 5, 2017

(54) SYSTEMS AND METHODS FOR PROVIDING ELECTROMAGNETIC INTERFERENCE SHIELDING FOR INTEGRATED CIRCUIT MODULES

(71) Applicant: Skyworks Solutions, Inc., Woburn, MA (US)

(72) Inventors: Matthew Sean Read, Rancho Santa Margarita, CA (US); Hoang Mong Nguyen, Fountain Valley, CA (US); Sergio Joaquin Gonzalez, Mexicali (MX); Luis Eduardo Herrera, Mexicali (MX)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 126 days.

This patent is subject to a terminal disclaimer.

(21) Appl. No.: 13/893,605

(22) Filed: May 14, 2013

(65) Prior Publication Data
US 2013/0323408 A1    Dec. 5, 2013

Related U.S. Application Data

(60) Provisional application No. 61/653,888, filed on May 31, 2012.

(51) Int. Cl.
*H01L 23/552* (2006.01)
*H01L 21/56* (2006.01)
*H01L 23/00* (2006.01)

(52) U.S. Cl.
CPC .......... *H01L 23/552* (2013.01); *H01L 21/561* (2013.01); *H01L 24/97* (2013.01);
(Continued)

(58) Field of Classification Search
None
See application file for complete search history.

(56) References Cited

U.S. PATENT DOCUMENTS

| | | | |
|---|---|---|---|
| 3,568,933 A | * | 3/1971 | Macguire-Cooper ..... B05B 1/26 239/337 |
| 5,632,942 A | | 5/1997 | Yeh et al. |

(Continued)

FOREIGN PATENT DOCUMENTS

| | | | | |
|---|---|---|---|---|
| JP | 2005111295 A | * | 4/2005 | ............... B05D 1/26 |
| JP | 2005-199165 A | | 7/2005 | |

OTHER PUBLICATIONS

Joseph, Collector Car Restoration Bible, (2005), pp. 378-380.*

(Continued)

*Primary Examiner* — Lisha Jiang
(74) *Attorney, Agent, or Firm* — Knobbe, Martens, Olson & Bear LLP

(57) ABSTRACT

Systems and methods disclose maintaining paint thickness uniformity over the surface of a cap encapsulating at least one integrated circuit (IC) module on a panel of IC modules. The layer of conductive paint electrically couples with wirebonds on the panel to form at least part of an electromagnetic interference (EMI) or radio frequency interference (RFI) shield that attenuates EMI or RFI during operation of the IC module. Optimizing the spray nozzle diameter, fluid pressure, coaxial air pressure, spray heights, speeds, and spray pattern achieves paint thickness control. A uniform coating of conductive paint provides a more effective EMI or RFI shield during the operation of the IC modules.

17 Claims, 15 Drawing Sheets

(52) U.S. Cl.
CPC .... *H01L 24/73* (2013.01); *H01L 2224/32225* (2013.01); *H01L 2224/48227* (2013.01); *H01L 2224/73265* (2013.01); *H01L 2224/97* (2013.01); *H01L 2924/1531* (2013.01); *H01L 2924/181* (2013.01); *H01L 2924/19105* (2013.01); *H01L 2924/3025* (2013.01)

(56) References Cited

U.S. PATENT DOCUMENTS

| | | | |
|---|---|---|---|
| 5,742,004 A * | 4/1998 | Greco et al. | 174/372 |
| 6,375,866 B1 | 4/2002 | Paneccasio, Jr. et al. | |
| 7,958,629 B2 | 6/2011 | Thompson et al. | |
| 8,071,431 B2 | 12/2011 | Hoang et al. | |
| 8,399,972 B2 | 3/2013 | Hoang et al. | |
| 8,832,931 B2 | 9/2014 | Thompson et al. | |
| 8,948,712 B2 | 2/2015 | Chen et al. | |
| 2002/0046879 A1 | 4/2002 | Barabash | |
| 2005/0275071 A1 | 12/2005 | Masuda | |
| 2007/0030661 A1 | 2/2007 | Morris et al. | |
| 2007/0241440 A1 * | 10/2007 | Hoang et al. | 257/685 |
| 2009/0084599 A1 * | 4/2009 | Severance et al. | 174/350 |
| 2009/0159328 A1 | 6/2009 | Dai et al. | |
| 2010/0006988 A1 | 1/2010 | Tang et al. | |
| 2011/0261550 A1 | 10/2011 | Wong et al. | |
| 2012/0137514 A1 | 6/2012 | Hoang et al. | |
| 2012/0146178 A1 | 6/2012 | Hoang et al. | |
| 2013/0021219 A1 | 1/2013 | Agarwal et al. | |
| 2013/0323408 A1 | 12/2013 | Read et al. | |
| 2013/0323409 A1 * | 12/2013 | Read et al. | 427/98.4 |
| 2014/0016277 A1 | 1/2014 | Chen et al. | |
| 2015/0070861 A1 | 3/2015 | Thompson et al. | |

OTHER PUBLICATIONS

Duffy, Auto Body Repair Technology, (2008), pp. 888-890.*
International Search Report and Written Opinion for PCT/US2013/041454, Aug. 27, 2013, 11 pages.
International Search Report and Written Opinion for PCT/US2013/041460, Aug. 23, 2013, 10 pages.

* cited by examiner

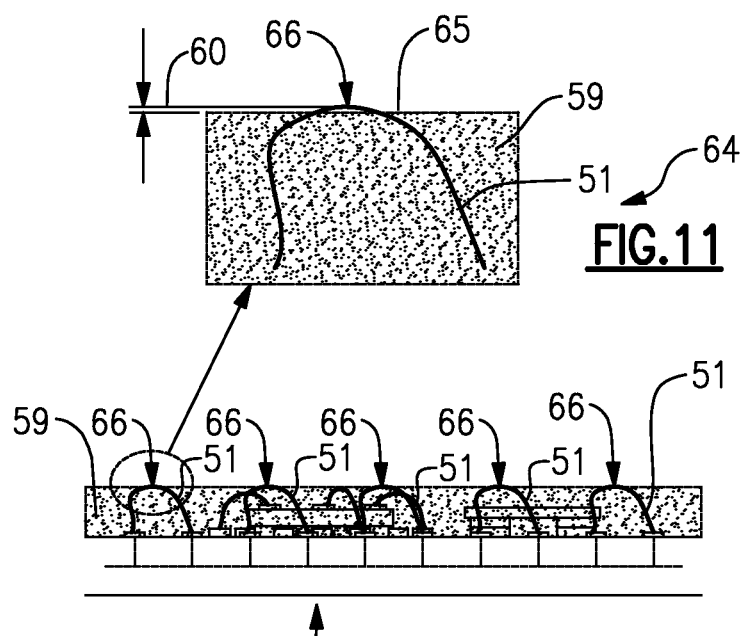
FIG. 11
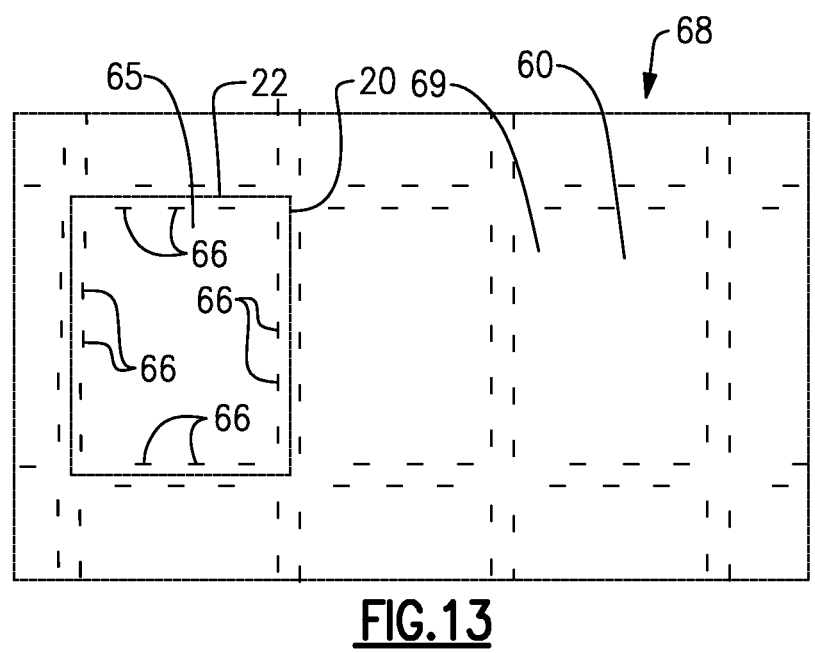
FIG. 12
FIG. 13

| VALVE PRESSURE=75 PSI NEEDLE=21 GAUGE AIR CAP=22.5° FLUID PRESSURE=2.5 PSI AIR ASSIST PRESSURE=4 PSI N=9 | SPRAY PARAMETERS | | | LINE PARAMETERS | | | | LINE PATTERN PARAMETERS | | | | |
|---|---|---|---|---|---|---|---|---|---|---|---|---|
| | SPEED IN/SEC | Z INCHES | # OF PASS | FLUID ON MSEC | FLUID OFF MSEC | ASSIST ON MSEC | ASSIST OFF MSEC | LINE | START X INCH | START Y INCH | FINISH X INCH | FINISH Y INCH |
| PERIMETER SPRAY | 30 | 0.25 | 2 | 10 | 7.5 | 10 | 7.5 | 1 | 0.09 | 0.18 | 7.15 | 0.18 |
| | | | | | | | | 2 | 7.05 | 0.2 | 7.05 | 2.03 |
| | | | | | | | | 3 | 7.15 | 2.055 | 0.09 | 2.055 |
| | | | | | | | | 4 | 0.16 | 2.03 | 0.16 | 0.2 |
| STAGGERED FLOOD SPRAY N LINES | 30 | 0.4 | 1 | 5 | 8 | 5 | 8 | 1 | 7.1 | 0.37 | 0.1 | 0.37 |
| | | | | | | | | 2 | 0.1 | 0.56 | 7.1 | 0.56 |
| | | | | | | | | 3 | 7.1 | 0.75 | 0.1 | 0.75 |
| | | | | | | | | 4 | 0.1 | 0.94 | 7.1 | 0.94 |
| | | | | | | | | 5 | 7.1 | 1.13 | 0.1 | 1.13 |
| | | | | | | | | 6 | 0.1 | 1.32 | 7.1 | 1.32 |
| | | | | | | | | 7 | 7.1 | 1.51 | 0.1 | 1.51 |
| | | | | | | | | 8 | 0.1 | 1.7 | 7.1 | 1.7 |
| | | | | | | | | 9 | 7.1 | 1.89 | 0.1 | 1.89 |
| FLOOD SPRAY N+1 LINES | 30 | 0.4 | 1 | 5 | 8 | 5 | 8 | 1 | 0.1 | 0.275 | 7.1 | 0.275 |
| | | | | | | | | 2 | 7.1 | 0.465 | 0.1 | 0.465 |
| | | | | | | | | 3 | 0.1 | 0.655 | 7.1 | 0.655 |
| | | | | | | | | 4 | 7.1 | 0.845 | 0.1 | 0.845 |
| | | | | | | | | 5 | 0.1 | 1.035 | 7.1 | 1.035 |
| | | | | | | | | 6 | 7.1 | 1.225 | 0.1 | 1.225 |
| | | | | | | | | 7 | 0.1 | 1.415 | 7.1 | 1.415 |
| | | | | | | | | 8 | 7.1 | 1.605 | 0.1 | 1.605 |
| | | | | | | | | 9 | 0.1 | 1.795 | 7.1 | 1.795 |
| | | | | | | | | 10 | 7.1 | 1.925 | 0.1 | 1.925 |

FIG.18

| VALVE PRESSURE=75 PSI<br>NEEDLE=21 GAUGE<br>AIR CAP=22.5°<br>FLUID PRESSURE=2 PSI<br>AIR ASSIST PRESSURE=3 PSI<br>N=9 | SPRAY PARAMETERS | | | LINE PARAMETERS | | | | LINE PATTERN PARAMETERS | | | | |
|---|---|---|---|---|---|---|---|---|---|---|---|---|
| | | | | | | | | | START | | FINISH | |
| | SPEED IN/SEC | Z INCHES | # OF PASS | FLUID ON MSEC | FLUID OFF MSEC | ASSIST ON MSEC | ASSIST OFF MSEC | LINE | X INCH | Y INCH | X INCH | Y INCH |
| PERIMETER SPRAY | 30 | 0.25 | 2 | 6.37 | 8.25 | 6.37 | 6.25 | 1 | 0.080 | 0.200 | 7.160 | 0.200 |
| | | | | | | | | 2 | 7.070 | 0.200 | 7.070 | 2.020 |
| | | | | | | | | 3 | 7.160 | 2.030 | 0.080 | 2.030 |
| | | | | | | | | 4 | 0.150 | 2.020 | 0.150 | 0.200 |
| STAGGERED FLOOD SPRAY N LINES | 30 | 0.4 | 1 | 5.26 | 10.0 | 5.26 | 7 | 1 | 7.055 | 0.370 | 0.170 | 0.370 |
| | | | | | | | | 2 | 0.170 | 0.560 | 7.055 | 0.560 |
| | | | | | | | | 3 | 7.055 | 0.750 | 0.170 | 0.750 |
| | | | | | | | | 4 | 0.170 | 0.940 | 7.055 | 0.940 |
| | | | | | | | | 5 | 7.055 | 1.130 | 0.170 | 1.130 |
| | | | | | | | | 6 | 0.170 | 1.320 | 7.055 | 1.320 |
| | | | | | | | | 7 | 7.055 | 1.510 | 0.170 | 1.510 |
| | | | | | | | | 8 | 0.170 | 1.700 | 7.055 | 1.700 |
| | | | | | | | | 9 | 7.055 | 1.890 | 0.170 | 1.890 |
| FLOOD SPRAY N+1 LINES | 30 | 0.4 | 1 | 5.26 | 10.0 | 5.26 | 7 | 1 | 0.170 | 0.275 | 7.055 | 0.275 |
| | | | | | | | | 2 | 7.055 | 0.465 | 0.170 | 0.465 |
| | | | | | | | | 3 | 0.170 | 0.655 | 7.055 | 0.655 |
| | | | | | | | | 4 | 7.055 | 0.845 | 0.170 | 0.845 |
| | | | | | | | | 5 | 0.170 | 1.035 | 7.055 | 1.035 |
| | | | | | | | | 6 | 7.055 | 1.225 | 0.170 | 1.225 |
| | | | | | | | | 7 | 0.170 | 1.415 | 7.055 | 1.415 |
| | | | | | | | | 8 | 7.055 | 1.605 | 0.170 | 1.605 |
| | | | | | | | | 9 | 0.170 | 1.795 | 7.055 | 1.795 |
| | | | | | | | | 10 | 7.055 | 1.985 | 0.170 | 1.985 |

FIG.19

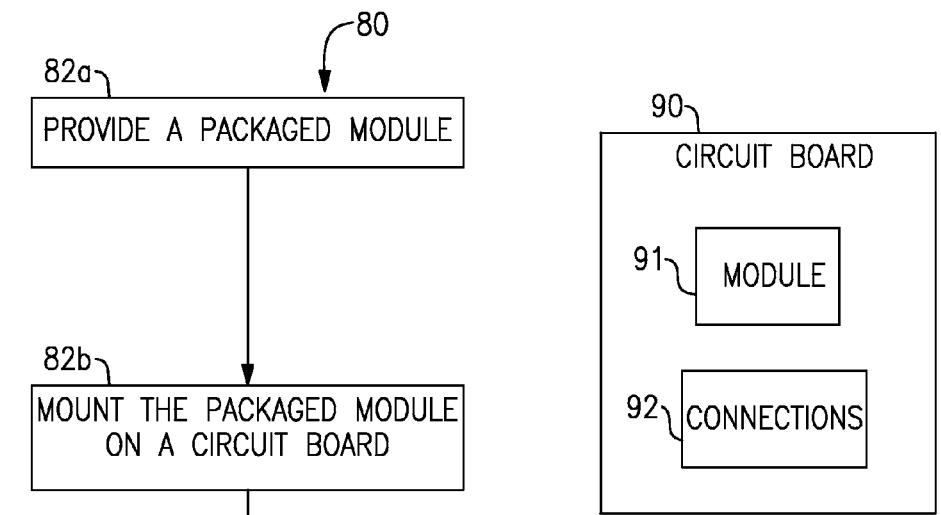
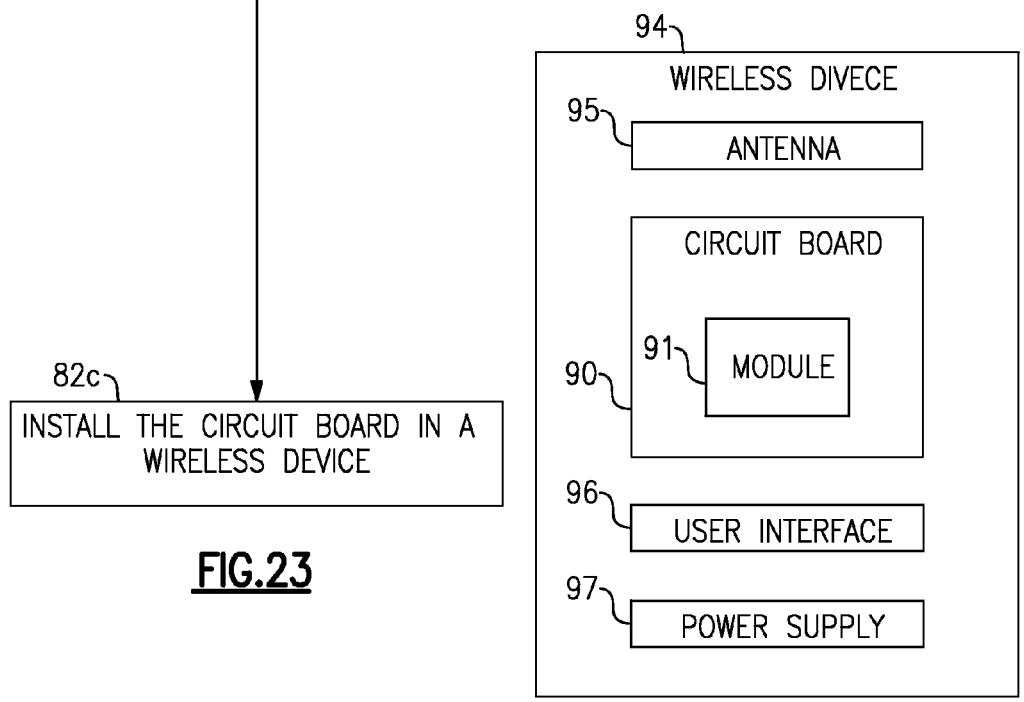

SYSTEMS AND METHODS FOR PROVIDING ELECTROMAGNETIC INTERFERENCE SHIELDING FOR INTEGRATED CIRCUIT MODULES

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Conductive paint is widely used in the electronics industry for Electromagnetic Interference (EMI) shielding, Radio Frequency Interference (RFI) shielding, and electrostatic discharge (ESD) control. For conductivity, the paint contains metal particles or flakes, and for high conductivity, the metal particles can be copper, nickel, silver covered copper, silver or other expensive conductive materials. It is often sprayed, brushed, or rolled onto plastic parts which are then assembled into EMI or RFI shielded housings for sensitive electronic circuits or devices.

SUMMARY

Conductive paint sprayed onto the surface of integrated circuit (IC) modules during the manufacturing process can provide at least part of a metal shield which reduces, attenuates or lessens EMI or RFI during the operation of the integrated circuits.

To provide uniform coverage, conventional spray methods increase the distance between the paint applicator and the surface to be painted. This greatly increases the overspray, consuming almost twice the volume of paint that is actually required to cover a panel of IC modules, which greatly increases the price per unit for paint costs. To reduce overspray, conventional methods decrease the distance between the paint applicator and the surface to be painted. When this is done, track lines appear indicating there are hills and valleys in the paint surface. The overall paint thickness is not uniform, which does not provide a uniform EMI/RFI shield.

Certain embodiments relate to a method of spraying a surface with conductive paint. The method comprises spraying N axially elongate first bands of conductive paint along a longitudinal axis of a surface and advancing along a vertical axis of the surface a first distance after spraying each first band of conductive paint. The method further comprises spraying N+1 axially elongate second bands of conductive paint along the longitudinal axis of the surface and advancing along the vertical axis of the surface a second distance after each second band of conductive paint. The second bands of conductive paint are interspersed between the first bands of conductive paint to provide an approximately uniform thickness of conductive paint on the surface. The method further comprises spraying the perimeter of the surface with third bands of conductive paint. The steps of spraying the N first bands of conductive paint, spraying the N+1 second bands of conductive paint, and spraying the perimeter with the third bands of conductive paint repeat until the desired paint thickness is reached.

According to a number of embodiments, the disclosure relates to a method of spraying a surface of a panel of integrated circuit (IC) modules with conductive paint to provide at least part of an electromagnetic interference (EMI) or radio frequency interference (RFI) shield that attenuates EMI or RFI during operation of the IC module. The method comprises spraying N axially elongate first bands of conductive paint including metal particles along a longitudinal axis of a panel including integrated circuit (IC) modules and advancing along a vertical axis of the panel a first distance after spraying each first band of the conductive paint, and spraying N+1 axially elongate second bands of the conductive paint along the longitudinal axis of the panel and advancing along the vertical axis of the panel a second distance after each second band of the conductive paint. The second bands of the conductive paint are interspersed between the first bands of the conductive paint to provide an approximately uniform layer of the conductive paint on an upper surface of the panel. The layer of conductive paint electrically couples with wirebonds on the panel to form at least part of an electromagnetic interference (EMI) or radio frequency interference (RFI) shield that attenuates EMI or RFI during operation of the IC module.

In accordance with various embodiments, a system for spraying a surface of a panel of integrated circuit (IC) modules with conductive paint to provide at least part of an electromagnetic interference (EMI) or radio frequency interference (RFI) shield that attenuates EMI or RFI during operation of the IC module is disclosed. The system comprises computer hardware including at least one computer processor, and computer-readable storage having computer-readable instructions that, when executed by the computer processor, cause the computer hardware to perform operations defined by the computer-executable instructions. The computer-readable instructions include spraying N axially elongate first bands of conductive paint including metal particles along a longitudinal axis of a panel including integrated circuit (IC) modules and advancing along a vertical axis of the panel a first distance after spraying each first band of the conductive paint, and spraying N+1 axially elongate second bands of the conductive paint along the longitudinal axis of the panel and advancing along the vertical axis of the panel a second distance after each second band of the conductive paint. The second bands of the conductive paint are interspersed between the first bands of the conductive paint to provide an approximately uniform layer of the conductive paint on an upper surface of the panel. The layer of conductive paint electrically couples with wirebonds on the panel to form at least part of an electromagnetic interference (EMI) or radio frequency interference (RFI) shield that attenuates EMI or RFI during operation of the IC module.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 11 shows a detail of a side view of how an upper portion of the overmold can be removed to expose upper portions of the EM isolation wirebonds.

FIG. 12 shows a side view of how an upper portion of the overmold can be removed to expose upper portions of the EM isolation wirebonds.

FIG. 13 shows a photograph of a portion of a panel where a portion of the overmold has its upper portion removed to better expose the upper portions of the EM isolation wirebonds.

FIG. 18 shows a photograph of a panel where the conductive layer can be a spray-on metallic paint.

FIG. 19 is an exemplary table showing spray parameters, line parameters, and spray pattern parameters, according to an embodiment.

FIG. 23 shows a process that can be implemented to install a packaged module having one or more features as described herein on a circuit board such as the phone board of FIG. 22.

FIG. 24 schematically depicts the circuit board with the packaged module installed thereon.

FIG. 25 schematically depicts a wireless device having the circuit board with the packaged module installed thereon.

DETAILED DESCRIPTION OF THE PREFERRED EMBODIMENT

The features of the systems and methods will now be described with reference to the drawings summarized above. Throughout the drawings, reference numbers are re-used to indicate correspondence between referenced elements. The drawings, associated descriptions, and specific implementation are provided to illustrate embodiments of the inventions and not to limit the scope of the disclosure.

Overview

Figure 1:
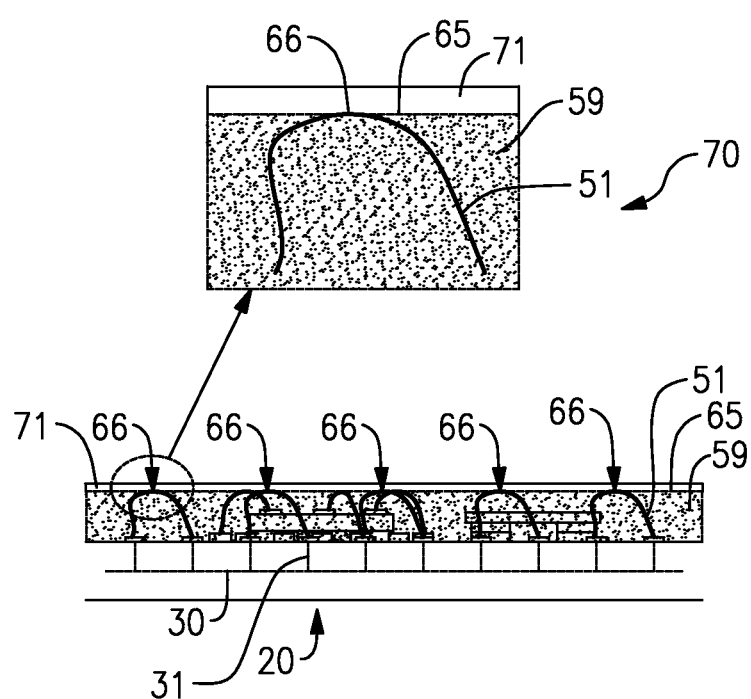
FIG. 1 shows a side view of a conductive layer formed over the overmold such that the conductive layer is in electrical contact with the exposed upper portions of the EM isolation wirebonds.
Figure 2:
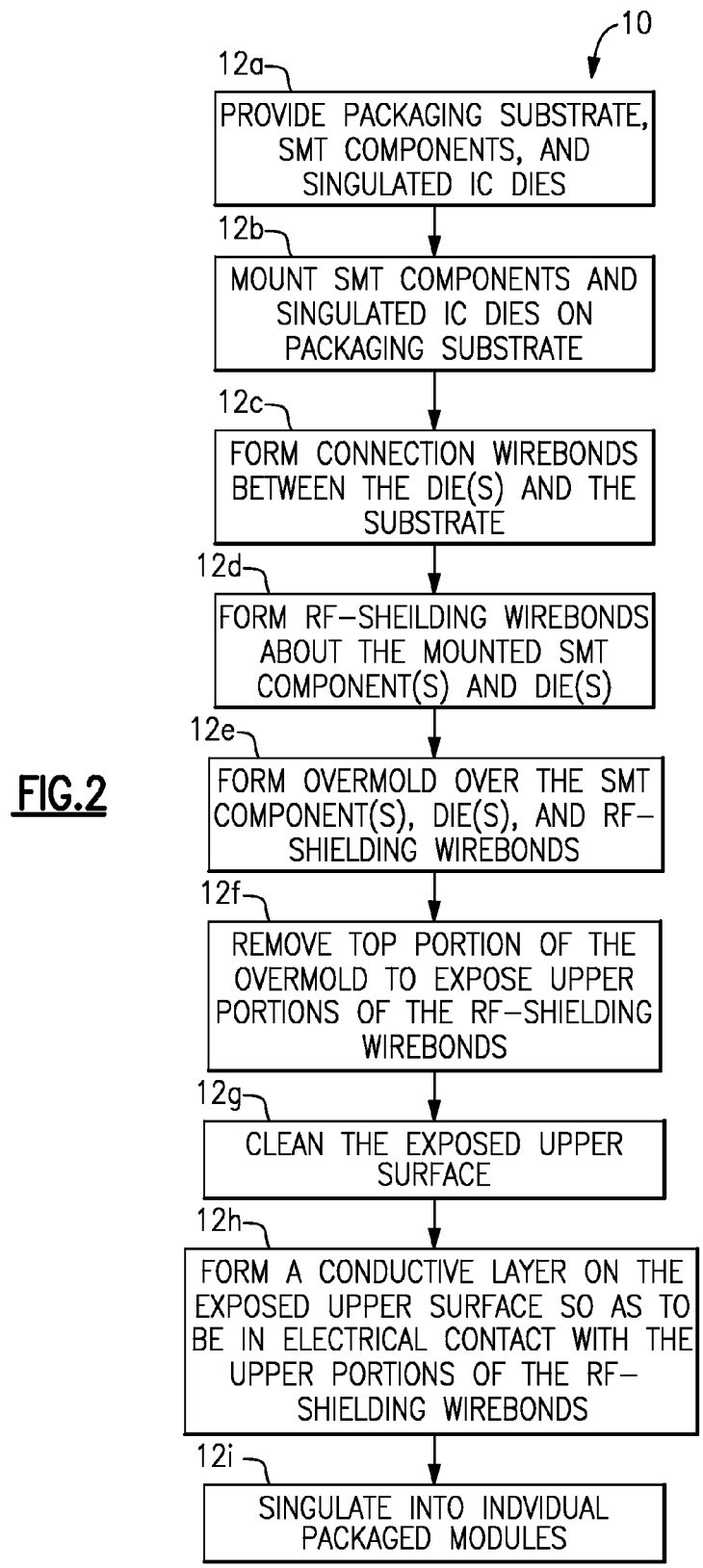
FIG. 2 shows a process that can be implemented to fabricate a packaged module that includes an interconnected RF-shielding structure and/or shielded volume.

FIG. 2 shows a process 10 that can be implemented to fabricate a packaged module having an interconnected RF-shielding structure and/or shielded volume that attenuates EMI or RFI during operation of the IC module as described herein. FIGS. 1 and 3-21 show various parts and/or stages of various steps associated with the process 10 of FIG. 2.

In block 12h of FIG. 2, an electrically conductive layer can be formed on the new exposed upper surface of an overmold structure on a panel of IC modules, so that the conductive layer is in electrical contact with the upper portions of RF-shielding wirebonds adjacent to the IC module. Such a conductive layer can be formed by a number of different techniques, including methods such as spraying or printing. Spraying conductive paint to form the conductive layer is described below.

FIG. 1 shows an example configuration 70 where an electrically conductive layer 71 has been formed over an upper surface 65 of an overmold structure 59 encapsulating components of IC modules on a substrate 20 having a ground plane 30. As described herein, the upper surface 65 better exposes upper portions 66 of RF-shielding wirebonds 51. Accordingly, the formed conductive layer 71 forms improved contacts with the upper portions 66 of the RF-shielding wirebonds 51.

The RF-shielding wirebonds 51 and the ground plane 30 can yield an interconnected RF-shielding structure at sides and underside of the area defined by the RF-shielding wirebonds 51. Connections between the components and the ground plane 30 are depicted as dotted lines 31. With the upper conductive layer 71 in electrical contact with the RF-shielding wirebonds 51, the upper side above the area is now shielded as well, thereby yielding a shielded volume.

Figure 3:
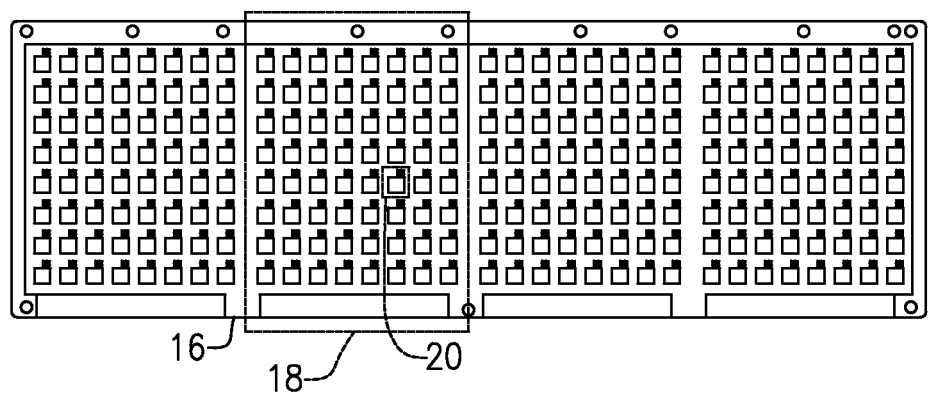
FIG. 3 a show front side of an example laminate panel configured to receive a plurality of dies for formation of packaged modules.

In block 12a of FIG. 2, a packaging substrate and parts to be mounted on the packaging substrate can be provided. Such parts can include, for example, one or more surface-mount technology (SMT) components and one or more singulated dies having integrated circuits (ICs). FIG. 3 shows that in some embodiments, the packaging substrate can include a laminate panel 16. FIG. 3 shows the example panel's front side. The panel 16 can include a plurality of individual module substrates 20 arranged in groups that are sometimes referred to as cookies 18.

In block 12b of FIG. 2, various steps can be performed to allow mounting of one or more SMT devices and one or more dies. The various steps can include but are not limited to applying solder paste on the module substrate to allow mounting of one or more SMT devices, positioning one or more SMT devices on the solder contacts having solder paste, performing a reflow operation to melt the solder paste to solder the one or more SMT devices on their respective contact pads, removing solder residue from the reflow operation, applying adhesive on one or more selected areas on the module substrate 20 to allow mounting of one or more dies, positioning one or more dies on the selected areas with adhesive applied thereon, curing the adhesive between the die and the die-mounting area, removing adhesive residue from the mounting operation, and the like.

Figure 4:
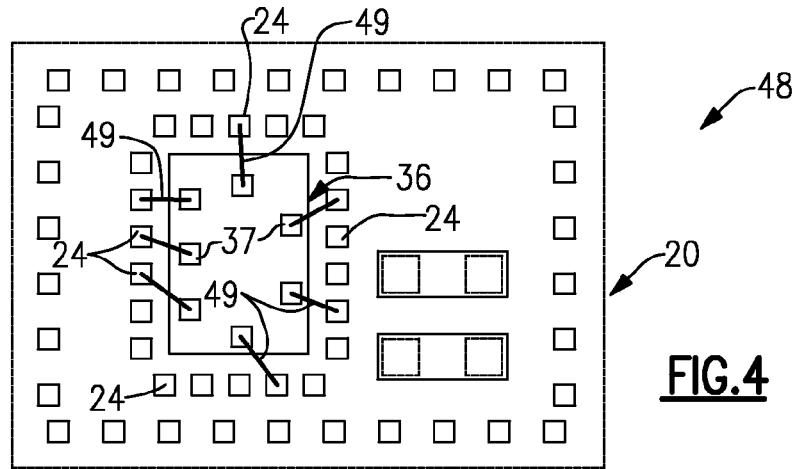
FIGS. 4 and 5 show various views of the die electrically connected to the laminate substrate by example wirebonds.
Figure 5:
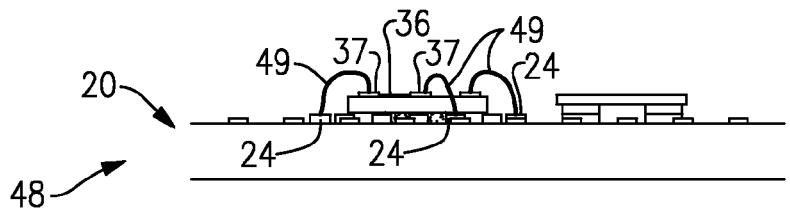

In block 12c of FIG. 2, electrical connections such as wirebonds can be formed between the mounted die(s) and corresponding contact pads on the module substrate 20. FIGS. 4 and 5 show an example configuration 48 where a number of wirebonds 49 are formed between the contact pads 37 of the die 36 and the contact pads 24 of the module substrate 20. Such wirebonds can provide electrical connections for signals and/or power to and from one or more circuits of the die 36. In some implementations, the formation of the foregoing wirebonds can be achieved by an automated wirebonding machine.

Figure 6:
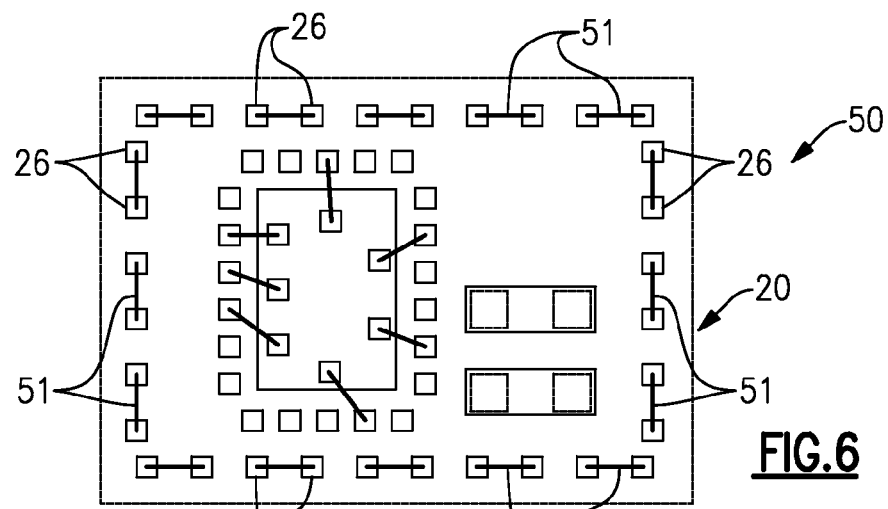
FIGS. 6 and 7 show various views of wirebonds formed on the laminate substrate and configured to facilitate electromagnetic (EM) isolation between an area defined by the wirebonds and areas outside of the wirebonds.
Figure 7:
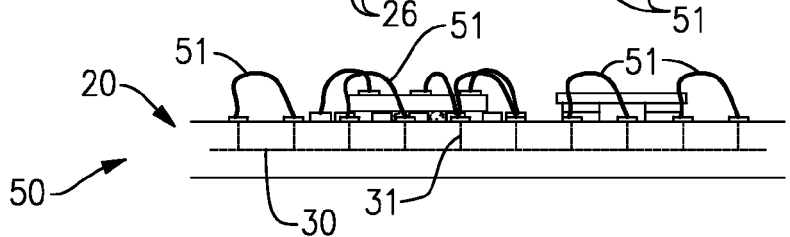

In block 12d of FIG. 2, a plurality of RF-shielding wirebonds can be formed about a selected area on the module substrate 20. FIGS. 6 and 7 show an example configuration 50 where a plurality of RF-shielding wirebonds 51 is formed on wirebond pads 26. The wirebond pads 26 are schematically depicted as being electrically connected (dotted lines 31) with one or more reference planes such as a ground plane 30. In some embodiments, such a ground plane can be disposed within the module substrate 20. The foregoing electrical connections between the RF-shielding wirebonds 51 and the ground plane 30 can yield an interconnected RF-shielding structure at sides and underside of the area defined by the RF-shielding wirebonds 51. As described herein, a conductive layer can be formed above such an area and connected to upper portions of the RF-shielding wirebonds 51 to thereby form an RF-shielded volume.

In the example configuration 50, the RF-shielding wirebonds 51 are shown to form a perimeter around the area where the die (36) and the SMT devices (43) are located. Other perimeter configurations are also possible. For example, a perimeter can be formed with RF-wirebonds around the die, around one or more of the SMT devices, or any combination thereof. In some implementations, an RF-wirebond-based perimeter can be formed around any circuit, device, component or area where RF-isolation is desired. For the purpose of description, it will be understood that RF-isolation can include keeping RF signals or noise from entering or leaving a given shielded area.

In the example configuration 50, the RF-shielding wirebonds 51 are shown to have an asymmetrical side profile configured to facilitate controlled deformation during a molding process as described herein. Additional details concerning such wirebonds can be found in, for example, PCT Publication No. WO 2010/014103 titled "SEMICONDUCTOR PACKAGE WITH INTEGRATED INTERFERENCE SHIELDING AND METHOD OF MANUFACTURE THEREOF." In some embodiments, other shaped RF-shielding wirebonds can also be utilized. For example, generally symmetric arch-shaped wirebonds as described in U.S. Pat. No. 8,071,431, titled "OVERMOLDED SEMICONDUCTOR PACKAGE WITH A WIREBOND CAGE FOR EMI SHIELDING," can be used as RF-shielding wirebonds in place of or in combination with the shown asymmetric wirebonds. In some embodiments, RF-shielding wirebonds do not necessarily need to form a loop shape and have both ends on the surface of the module substrate. For example, wire extensions with one end on the surface of the module substrate and the other end positioned above the surface (for connecting to an upper conductive layer) can also be utilized.

In the example configuration 50 of FIGS. 6 and 7, the RF-shielding wirebonds 51 are shown to have similar heights that are generally higher than heights of the die-connecting wirebonds (49). Such a configuration allows the die-connecting wirebonds (49) to be encapsulated by molding compound as described herein, and be isolated from an upper conductive layer to be formed after the molding process.

Figure 8:
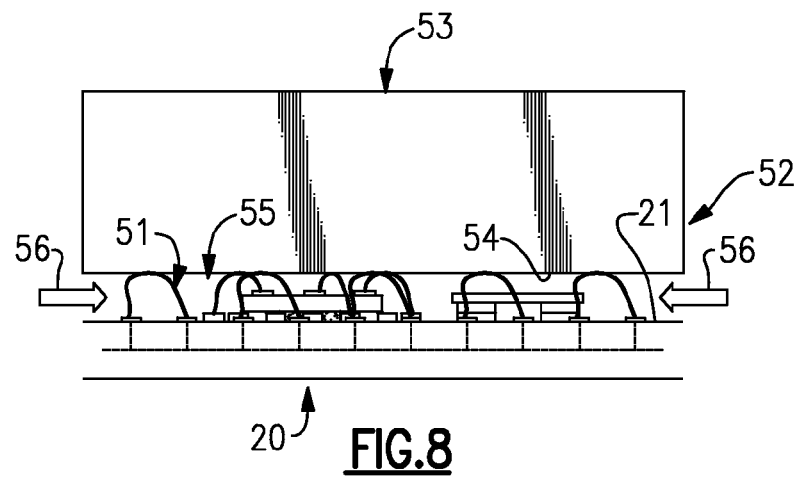
FIG. 8 shows a side view of molding configuration for introducing molding compound to a region above the laminate substrate.

In block 12e of FIG. 2, an overmold can be formed over the SMT component(s), die(s), and RF-shielding wirebonds. FIG. 8 shows an example configuration 52 that can facilitate formation of such an overmold. A mold cap 53 is shown to be positioned above the module substrate 20 so that the lower surface 54 of the mold cap 53 and the upper surface 21 of the module substrate 20 define a volume 55 where molding compound can be introduced.

In some implementations, the mold cap 53 can be positioned so that its lower surface 54 engages and pushes down on the upper portions of the RF-shielding wirebonds 51. Such a configuration allows whatever height variations in the RF-shielding wirebonds 51 to be removed so that the upper portions touching the lower surface 54 of the mold cap 53 are at substantially the same height. When the mold compound is introduced and an overmold structure is formed, the foregoing technique maintains the upper portions of the encapsulated RF-shielding wirebonds 51 at or close to the resulting upper surface of the overmold structure.

In the example molding configuration 52 of FIG. 8, molding compound can be introduced from one or more sides of the molding volume 55 as indicated by arrows 56. In some implementations, such an introduction of molding compound can be performed under heated and vacuum condition to facilitate easier flow of the heated molding compound into the volume 55.

Figure 9:
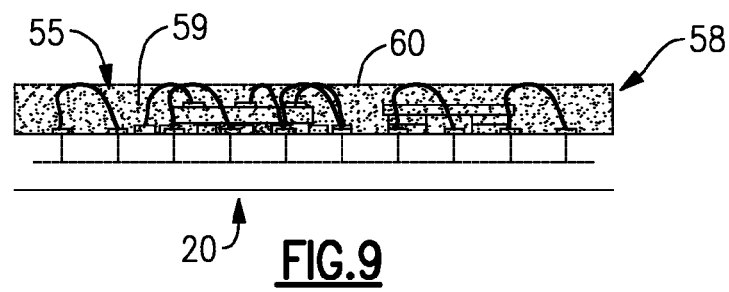
FIG. 9 shows a side view of an overmold formed via the molding configuration of FIG. 8.

FIG. 9 shows an example configuration 58 where molding compound has been introduced into the volume 55 as described in reference to FIG. 8 and the molding cap removed to yield an overmold structure 59 that encapsulates the various parts (e.g., die, die-connecting wirebonds, and SMT devices). The RF-shielding wirebonds are also shown to be substantially encapsulated by the overmold structure 59. The upper portions of the RF-shielding wirebonds are shown to be at or close to the upper surface 60 of the overmold structure 59.

Figure 10:
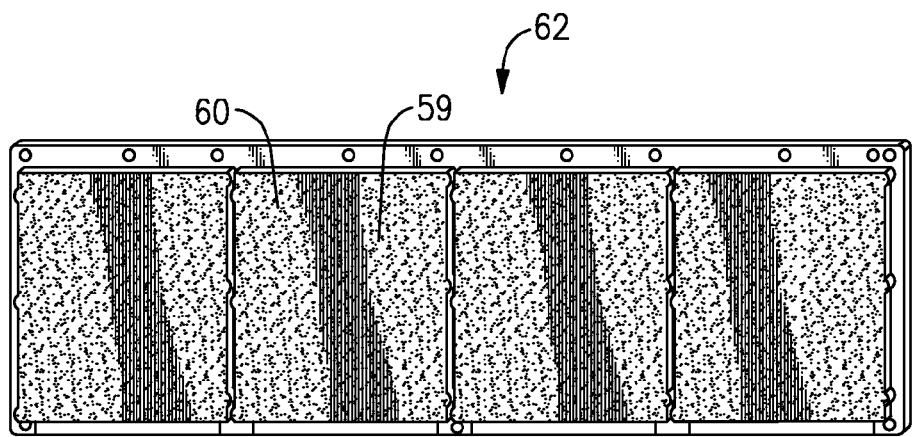
FIG. 10 shows the front side of a panel with the overmold.

FIG. 10 shows an example panel 62 that has overmold structures 59 formed over the multiple cookie sections. Each cookie section's overmold structure can be formed as described herein in reference to FIGS. 8 and 9. The resulting overmold structure 59 is shown to define a common upper surface 60 that covers the multiple modules of a given cookie section.

The molding process described herein in reference to FIGS. 8-10 can yield a configuration where upper portions of the encapsulated RF-shielding wirebonds are at or close to the upper surface of the overmold structure. Such a configuration may or may not result in the RF-shielding wirebonds forming a reliable electrical connection with an upper conductor layer to be formed thereon.

In block 12f of FIG. 2, a top portion of the overmold structure can be removed to better expose upper portions of the RF-shielding wirebonds. FIG. 12 shows an example configuration 64 where such a removal has been performed. FIG. 11 shows an enlarged detail of the example configuration 64. In the example, the upper portion of the overmold structure 59 is shown to be removed to yield a new upper surface 65 that is lower than the original upper surface 60 (from the molding process). Such a removal of material is shown to better expose the upper portions 66 of the RF-shielding wirebonds 51.

The foregoing removal of material from the upper portion of the overmold structure 59 can be achieved in a number of ways. FIG. 13 shows an example configuration 68 where such removal of material is achieved by sand-blasting. The example configuration 68 illustrates where material has been removed to yield the new upper surface 65 and to better expose upper portions 66 of the RF-shielding wirebonds. The example configuration 68 also illustrates where material has not been removed, so that the original upper surface 60 still remains. The region indicated as 69 is where the material-removal is being performed.

In the example shown in FIG. 13, a modular structure corresponding to the underlying module substrate 20 (depicted with a dotted box 22) is readily shown. Such modules will be separated after a conductive layer is formed over the newly formed upper surface 65.

In block 12g of FIG. 2, the new exposed upper surface resulting from the removal of material can be cleaned to yield a cleaner surface to facilitate improved adhesion of a conductive layer formed thereon.

In block 12h of FIG. 2, an electrically conductive layer can be formed on the new exposed upper surface of the overmold structure, so that the conductive layer is in electrical contact with the upper portions of the RF-shielding wirebonds. Such a conductive layer can be formed by a number of different techniques, including methods such as spraying or printing.

Spraying conductive paint on the surface of an IC panel to form the conductive layer as at least part of an EMI/RF shield is described in further detail below. Although certain embodiments are described herein with respect to the exemplary panel 1400 illustrated in FIG. 14, it is understood that in other embodiments, the panel of IC modules can have different dimensions, a different number of cookies, and each cookie can include different quantities of IC modules than the illustrated panel 1400.

Figure 14:
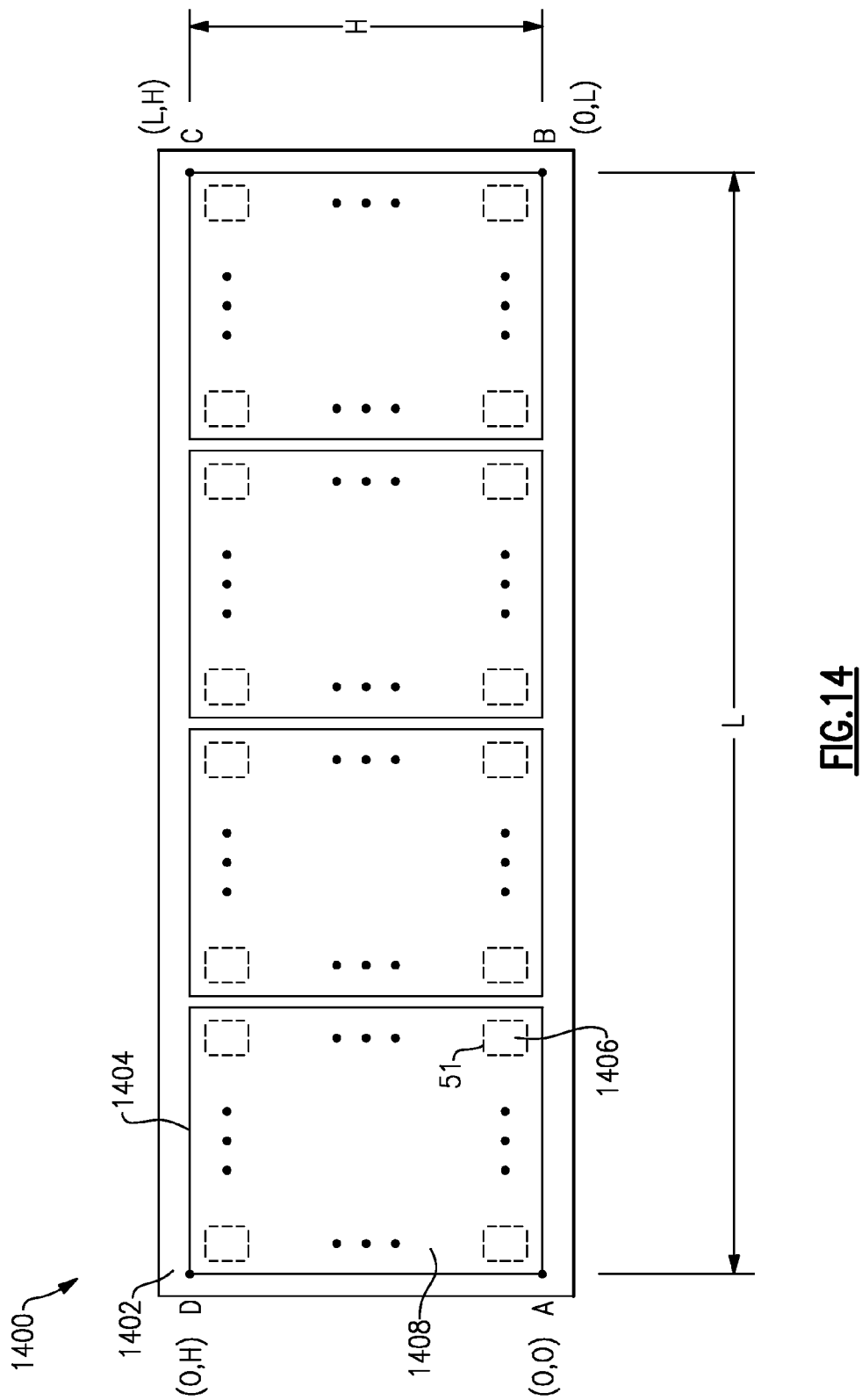
FIG. 14 illustrates a schematic block diagram of a four section panel with an upper portion of the overmold removed to better expose the upper portions of the EM isolation wirebonds.

FIG. 14 illustrates a schematic block diagram of an embodiment of a four section panel 1400 formed after completion of block 12f of FIG. 2. In the illustrated embodiment, panel 1400 comprises a module substrate 1402 and four abraded encapsulated sections or cookies 1404. Each cookie 1404 comprises at least one integrated circuit 1406 mounted to the substrate 1402, a cap or overmold 1408, and at least one RF-shielding wirebond 51.

The panel 1400 has a cookie length, L, along the longitudinal axis of the substrate 1402 of approximately 7.10 inches and a cookie height, H, along the vertical axis of the substrate 1402 of approximately 2.05 inches. In other embodiments, the panel dimensions can be other values. Typically, each cookie 1404 can comprise between approximately 4 and approximately 300 integrated circuits. In another embodiments, the panel 1400 can comprise less than or more than four cookies 1404. In further embodiments, each cookie 1404 can comprise less than 4 or more than 300 IC modules 1406.

In an embodiment, forming the conductive layer comprises covering the surface of the overmold 1408 with an approximately uniform or nearly uniform layer of conductive paint using a spray process. In an embodiment, the conductive paint is sprayed onto the surfaces 1408 of the panel 1400 during module manufacturing as at least part of an RFI or EMI shield for the IC modules 1406. Unlike conventional spray paint, the conductive paint includes metal particles or flakes and can be much more expensive. A conductive paint can contain flakes with an average size or a range of sizes. Flake sizes can vary from less than approximately 1 micron, approximately 1 micron to approximately 10 microns, approximately 10 microns to approximately 60 microns, and greater than approximately 60 microns. While in some embodiments, the flakes or particles are uniform in shape, in other embodiments, the flakes or particles are irregularly shaped. When the conductive paint is applied, a more efficient RFI or EMI shield is created for the IC modules 1406 if the flakes overlap to provide coverage of the surfaces 1408 without gaps or with small gaps between the flakes.

For example, a thin layer of corn flakes on a table surface where none of the flakes overlap does not cover the table surface. There are many gaps between the flakes where the table shows. Whereas a layer of corn flakes with an approximately uniform thickness such that the flakes overlap one another can provide total coverage, effective total coverage, or coverage that approximates total coverage of the table surface. While corn flakes are not conductive metal particles, the coverage analogy is applicable to the conductive paint. A layer of conductive paint including metal flakes where the conductive paint is applied with an approximate uniform thickness such that the metal flakes overlap one another can provide total coverage, effective total coverage, or coverage that approximates total coverage of the surface of the IC module 1406. This in turn provides a conductive surface in electrical contact with the wirebonds 51 for each IC module 1406, forming at least part of an EMI/RFI shield structure or volume for each IC module 1406.

Another quality of the conductive paint which affects the paint coverage is the paint viscosity. This may be an inherent quality of the paint or may be user adjustable with the addition of a suitable paint thinner. A more viscous paint will flow more slowly than a less viscous paint and may increase manufacturing throughput time, which in turn increases manufacturing costs. The less viscous paint may flow more quickly than the more viscous paint, but may provide spotty paint and/or spotty conductive particle coverage, which may provide poor EMI or RFI shielding.

Due to the expense of the conductive paint, it is desirable to reduce the overspray. Overspray is the application of the conductive paint to any surface other than the surfaces 1408 on the panel 1400. The conventional method of reducing the overspray is to apply the paint closer to the surface to be painted such that the spread of the spray is reduced. This also creates a non-uniform surface with peaks and valleys in the applied paint.

Due to the use of the conductive paint as an EMI or RFI shield, it is desirable to form a uniform or approximately uniform layer of conductive metal particles over the IC modules 1406 with no or small gaps between the metal particles as described above. The conventional method of applying a uniform layer of a sprayed material is to apply the paint farther from the surface to be painted such that the spread of the spray is increased. This also increases the overspray.

In one embodiment, a paint sprayer comprising a spray head and a paint delivery system delivers the conductive paint to the IC panel 1400. Examples of paint sprayer spray heads are standard flux material spray heads, automated spray booths, jetting systems, and the like. Examples of paint delivery systems are an air atomization delivery system, an ultrasonic atomization paint delivery system, a regular air spray paint delivery system, automotive spray systems, and the like. In an embodiment, the paint sprayer is computer controlled and user programmable, where the user program is executed by the paint sprayer computer. The spray head comprises a spray nozzle and the spray nozzle includes a needle from which the paint enters the delivery system. Needles of various sizes can be used. The size of the needle depends at least in part on the size of the conductive particles in the paint and/or at least in part on the viscosity of the paint. If the needle is too small, the particles will clog the needle. The size of the needle also depends in part on the desired rate at which the paint exits the needle. A larger needle provides a greater rate of paint flow than a smaller needle. In one embodiment, needle sizes range from approximately 14 gauge to approximately 32 gauge. In other embodiments, larger or smaller needles can be used.

Paint sprayers include additional factors that may be an inherent quality of the type of paint sprayer, or may be user settable. For example, in a paint sprayer with an air atomizer paint delivery system, in addition to choosing the needle size, the user may vary factors, such as, for example, the valve pressure, the air cap, the fluid pressure, the air assist pressure, and the like. The valve pressure controls the rate in which the seat valve opens and closes to allow the paint to flow to the nozzle. The air cap is measured in degrees and varies the angle of the cavity used to atomize the paint. The fluid pressure is the pressure applied to the paint reservoir to control the rate the conductive paint is pushed through the nozzle when the seat valve is opened and the air assist pressure is the pressure applied to the air cap to atomize the paint to apply it to the IC panel 1400.

In addition, the user can adjust the speed at which the spray head travels and the distance of the spray head above the surface to be painted. As described above, when the spray head is too far above the surface to be painted, the paint spreads and oversprays. When the spray head is too close to the surface to be painted, the spray is less uniform. There are tradeoffs with the speed also. The faster the spray head travels, the throughput of modules during manufacturing increases, but a thinner paint line is laid down, creating non-uniform paint and conductive particle coverage.

Further factors include line parameters, such as a fluid on time, a fluid off time, an air assist on time, and an air assist off time. The fluid on time is the amount of time from the start of the spray head travel and to the start of the spray. The fluid off time is the time from the stop of the spray to the stop of the spray head travel. Similarly, the air assist on time is the time from the start of the spray head travel to the start of the flow of the air providing the atomization, and the air assist off time is the time from the stop of the flow of air providing the atomization to the stop of the spray head travel.

Once the above parameters are chosen for a desired paint line, taking into account the line width, overspray width, thickness, and uniformity of coverage for the line, the process in FIG. 2 block 12*h* can achieve a tight spray pattern that minimizes overspray and maintains acceptable paint thickness uniformity for the painted surfaces 1408. In an embodiment, the above parameters are chosen to optimize overspray reduction and uniform paint coverage for a perimeter paint spray pattern and surface area spray patterns, such as, a flood paint spray pattern and a staggered flood paint spray pattern, respectively for the panel 1400 of IC modules 1406.

Figure 15:
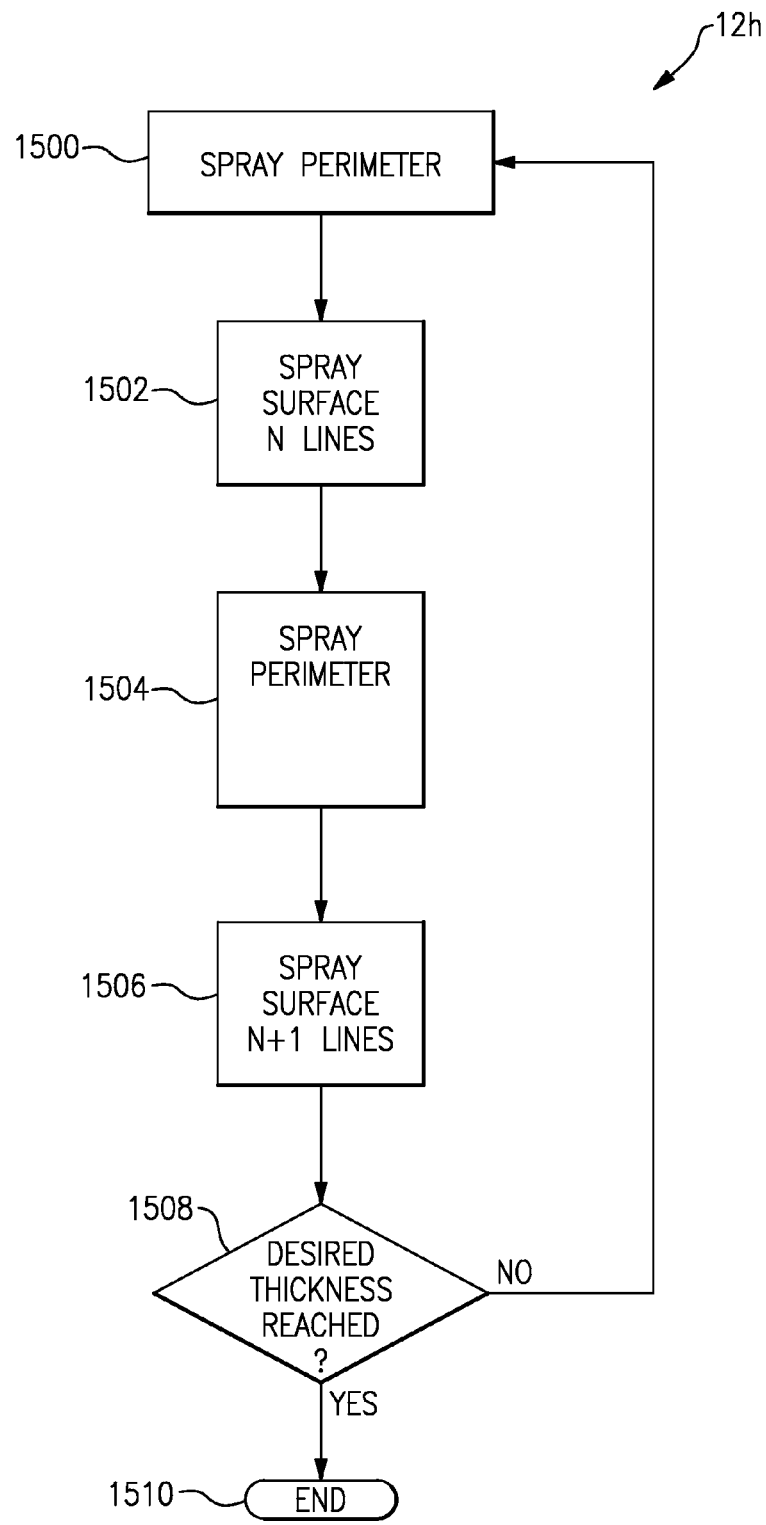
FIG. 15 is a flow chart illustrating a process for forming a conductive layer on a panel of IC modules, according to an embodiment.

FIG. 2 block 12*h* illustrates forming a conductive layer on the exposed surfaces 1408 of a panel 1400 of IC modules 1406 during the module fabrication process. FIG. 15 is a flow chart illustrating an embodiment of FIG. 2 block 12*h* in further detail. FIG. 15 illustrates the process used to spray conductive paint in spray patterns which form a uniform or nearly uniform or substantially uniform conductive layer having little or no overspray.

Figure 16A:
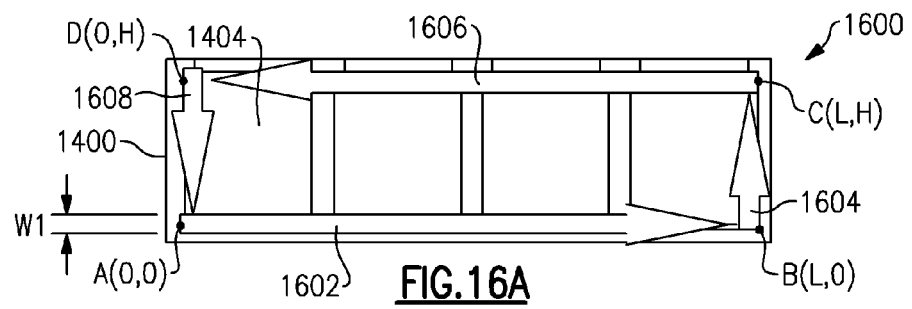
FIG. 16A is a schematic diagram illustrating a first perimeter spray pattern for the process of FIG. 14, according to an embodiment.
Figure 16B:
FIG. 16B is a schematic diagram illustrating a staggered flood spray pattern for the process of FIG. 14, according to an embodiment.
Figure 16C:
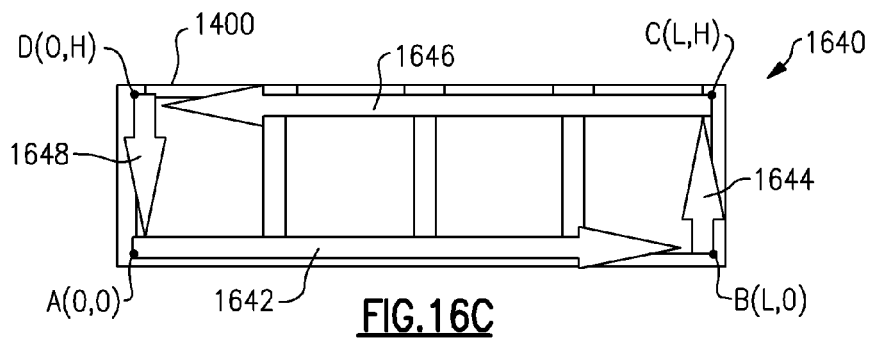
FIG. 16C illustrates is a schematic diagram illustrating a second perimeter spray pattern for the process of FIG. 14, according to an embodiment.
Figure 16D:
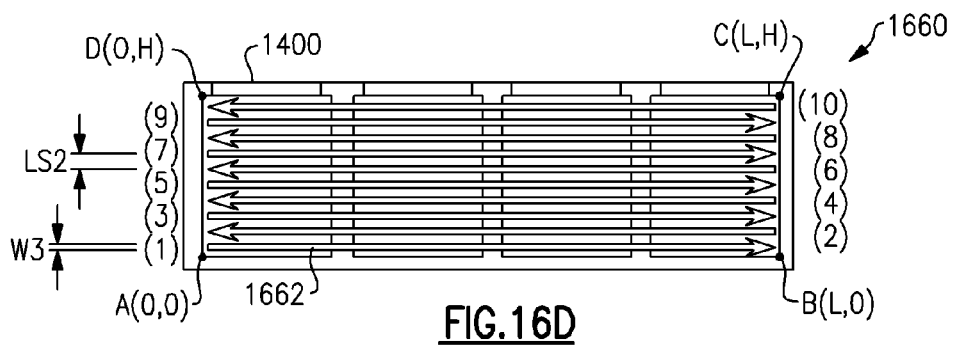
FIG. 16D is a schematic diagram illustrating a flood spray pattern for the process of FIG. 4, according to an embodiment.

FIGS. 16A-16D are schematic diagrams illustrating embodiments of the spray patterns for the panel 1400 of FIG. 14. FIG. 16A is a schematic diagram illustrating an embodiment of a first perimeter spray 1600. FIG. 16B is a schematic diagram illustrating an embodiment of a staggered flood spray 1620. FIG. 16C illustrates is a schematic diagram illustrating an embodiment of a second perimeter spray 1640 and FIG. 16D is a schematic diagram illustrating an embodiment of a flood spray 1660.

Referring to FIGS. 14, 15 and 16A, the process 12*h* at block 1500 sprays conductive paint in a perimeter spray pattern 1600 over the surfaces 1408 of the panel 1400. The spray paint apparatus sprays a first horizontal band of paint 1602 having a width W1 from approximately point A (0, 0) to approximately point B (L, 0). The first horizontal band 1602 is approximately parallel to the longitudinal or horizontal axis of the panel 1400.

The beginning of the band 1602 is approximately at point A and the end of the band 1602 is approximately at point B because the actual beginning and ending points of the band 1602 are adjusted upward along the vertical axis toward points D and C, respectively, at least a portion of the width W1. Further, the actual beginning point of the band 1602 is adjusted outward along the longitudinal axis toward point B at least a portion of the width W1 and the actual ending point of the band 1602 is further adjusted inward along the longitudinal axis toward point A at least a portion of the width W1.

The spray paint apparatus then sprays a first vertical band of paint 1604 having about width W1 from approximately point B (L,0) to approximately point C (L,H). The first vertical band 1604 is approximately parallel to the vertical axis of the panel 1400 and approximately perpendicular to the longitudinal or horizontal axis of the panel 1400.

The beginning of the band 1602 is approximately at point B and the end of the band 1602 is approximately at point C because the actual beginning and ending points of the band 1602 are adjusted inward along the longitudinal axis toward points A and D, respectively, at least a portion of the width W1. Further, the actual beginning point of the band 1604 is adjusted upward along the vertical axis toward point C at least a portion of the width W1 and the actual ending point of the band 1604 is further adjusted downward along the vertical axis toward point B at least a portion of the width W1.

The spray paint apparatus then sprays a second horizontal band of paint 1606 having about width W1 from approximately point C (L,H) to approximately point D (0,H). The second horizontal band 1606 is approximately parallel to the longitudinal or horizontal axis of the panel 1400.

The beginning of the band 1606 is approximately at point C and the end of the band 1606 is approximately at point D because the actual beginning and ending points of the band 1606 are adjusted downward along the vertical axis toward points B and A, respectively, at least a portion of the width W1. Further, the actual beginning point of the band 1606 is adjusted inward along the longitudinal axis toward point D at least a portion of the width W1 and the actual ending point of the band 1606 is further adjusted inward along the longitudinal axis toward point A at least a portion of the width W1.

The spray paint apparatus then sprays a second vertical band of paint 1608 having about width W1 from approximately point D (0,H) to approximately point A (0,0). The second vertical band 1608 is approximately parallel to the vertical axis of the panel 1400 and approximately perpendicular to the longitudinal or horizontal axis of the panel 1400.

The beginning of the band 1608 is approximately at point D and the end of the band 1608 is approximately at point A because the actual beginning and ending points of the band 1608 are adjusted outward along the longitudinal axis toward points C and B at least a portion of the width W1. Further, the actual beginning point of the band 1608 is adjusted downward along the vertical axis toward point A at least a portion of the width W1 and the actual ending point of the band 608 is further adjusted upward along the vertical axis toward point D at least a portion of the width W1.

The adjustments of the beginning and ending locations of the bands 1602, 1604, 1606, 1608 reduce or in some embodiments eliminate overspray along the perimeter of the group of cookies 1404. In addition, these adjustments prevent the perimeter bands of paint 1602, 1604, 1606, 1608 from overlapping, which would cause an additional layer of paint to be applied at the corners A, B, C, D of the group of cookies 1404.

In the described embodiment, the width W1 of the bands 1602, 1604, 1606, 1608 is approximately the same. In other embodiments, each band 1602, 1604, 1606, 1608 can have a differing width. In some embodiments, the width W1 is based at least in part on the height Z of the spray head above IC panel 1400. Although the order of spraying of the perimeter bands in the described embodiment occurs with band 1602 being sprayed first, followed by band 1604, which is then followed by band 1606 and ending with band 1608, the order of the spraying of the bands 1602, 1604, 1606, 1608 can be different in other embodiments.

Referring again to FIGS. 14, 15 and 16B, the process 12h at block 1502 performs a staggered flood spray pattern 1620. The staggered flood spray pattern 1620 comprises n lines of paint which are sprayed in alternating left to right and right to left bands which are approximately parallel to each other and the longitudinal axis of the panel 1400. In an embodiment, the spray head sprays the first band of the staggered flood spray pattern 1620 near the lower edge of the panel 1400 and subsequent bands advance upward over the surface of the panel 1400. In other embodiments, the spray begins near the top, the middle, or any other point of the panel 1400 and travels so as to cover the surfaces 1408 of the panel 1400.

In the embodiment illustrated in FIG. 16B, n=9, or in other words, the staggered flood spray pattern 1620 comprises 9 paint bands. In other embodiments, n can be more or less than 9. The number of bands, n, of the staggered flood spray pattern 1620 depends at least in part on the height, H, of the panel 1400 and/or on the width of the spray line.

Referring to FIG. 16B, the spray paint apparatus sprays a first horizontal band of paint 1622 having a width W2 from approximately point B (L,0) to approximately point A (0, 0). The first horizontal band 1622 is approximately parallel to the longitudinal or horizontal axis of the panel 1400.

The beginning of the band 1622 is approximately at point B and the end of the band 1622 is approximately at point A because the actual beginning and ending points of the band 1622 are adjusted upward along the vertical axis toward points D and C, respectively, to take into account the width W1 of the perimeter spray, the width W2 of the staggered flood spray bands, and line spacing LS1 of the staggered spray pattern 1620. Further, the actual beginning point of the band 1622 is adjusted inward along the longitudinal axis toward point A and the actual ending point of the band 1622 is adjusted outward along the longitudinal axis toward point B to take into account the width W1 of the perimeter spray.

In the illustrated embodiment, the first band 1622 begins at approximately (L−W1, 0.08+W1+½LS1), where L is the length of the panel, W1 is the width of the perimeter spray band of paint, and LS1 is the line spacing of the staggered flood spray pattern 1620. The starting point coordinates may vary depending on the (0, 0) coordinates of the spray paint apparatus and the IC panel 1400 being painted. The first band 1622 ends at approximately (W1, 0.08+W1+½LS1). The spray head advances upward along the vertical axis of the panel 1400 to spray the next band in the staggered flood spray pattern 1620. The spray head moves upward a distance approximately equal to the line spacing, LS1, and sprays a band of paint approximately parallel to the longitudinal axis of the panel 1400 ending at the beginning of the previous band but offset by the line spacing, LS1, above the previous line 1622.

This process repeats until the spray head applies n bands of paint to the surface of the panel 1400, where each band of paint in the staggered flood spray pattern 1620 is offset from the previous band of paint by the line spacing, LS1.

In the illustrated embodiment, the bands of paint in the staggered flood spray pattern 1640 are sprayed in an alternating left to right and right to left pattern. In another embodiment, the bands can be sprayed in an alternating right to left and left to right pattern. In yet other embodiments, each band can be sprayed from left to right, from right to left, or in any combination of left to right or right to left spray patterns.

Referring again to FIGS. 14, 15 and 16C, the process 12h at block 1504 performs a second perimeter spray pattern 1640. In an embodiment, the second perimeter spray pattern 1640 is the same as the first perimeter spray pattern 1600 described above. In other embodiments, the second perimeter spray pattern 1640 can have different beginning and ending points, a different order of application, wider or narrower band widths, or the like, than the first perimeter spray pattern 1600.

In the embodiment illustrated in FIG. 16C, the second perimeter spray pattern 640 comprises four perimeter bands of paint, 1642, 1644, 1646,1648. The second perimeter bands 1642, 1644, 1646, 1648 correspond to the bands 1602, 1604, 1606, 1608 of the first perimeter spray pattern 1600, respectively, and are applied as described above with respect to the first perimeter spray pattern 1600. The processes of spraying the first and second perimeter spray patterns 1600, 1640 provide spray edge control that facilitates high volume manufacturing and reduces paint overspray. The reduction in paint overspray reduces paint waste, which provides cost savings.

Referring again to FIGS. 14, 15 and 16D, the process 12h at block 1506 performs a flood spray pattern 1660. The flood spray pattern 1640 comprises n+1 lines of paint which are sprayed in alternating left to right and right to left which are approximately parallel to each other and the longitudinal axis of the panel 1400 and have a width W3. The n+1 bands of the flood spray pattern 1660 interleave before, after, and between the n bands of the staggered flood spray pattern 620 to provide near uniform coverage of the panel 1400.

In the embodiment illustrated in FIG. 6D, n=9, or in other words, the flood spray pattern 1660 comprises n+1=10 paint bands. While in other embodiments, n can be greater or less than 9, the relationship between the number of bands in the staggered flood spray pattern 1620 and the number in bands in the flood spray pattern 1660 is n:n+1. The number of bands, n+1, of the flood spray pattern 1660 depends at least in part on the height H of the panel 1400 and/or on the width of the spray line W3.

The number of bands or paint lines, n+1, in the flood spray pattern is determined by rounding up to the next integer value the result of [H−2W1]/W3 where H is the height of the panel 400, W1 is the width of the perimeter spray bands 1602, 1604, 1606, 1608, 1642, 1644, 1646, 1648, and W3 is the width of bands in the flood spray pattern 1660. The line spacing, LS2, between the bands of the flood spray pattern 1660 is [H−2W1]/[n+1].

In an embodiment, the spray head sprays the first band of the staggered flood spray pattern 1660 near the lower edge of the panel 1400 and subsequent bands advance upward over the surface of the panel 1400. In other embodiments, the spray begins near the top, the middle, or any other point of the panel 1400 and travels so as to cover the surface of the panel 1400. In an embodiment, the bands of paint in the flood spray pattern 1660 are sprayed in an alternating left to right and right to left pattern. In another embodiment, the bands can be sprayed in an alternating right to left and left to right pattern. In yet other embodiments, each band can be sprayed from left to right, from right to left, or in any combination of left to right or right to left spray patterns.

In the embodiment illustrated in FIG. 16D, the spray head begins traveling left to right. A first band 1662 begins at approximately (0, 0.08+W1+½LS2) and ends at approximately (L−W1, 0.08+W1+½LS2) where W1 is the width of bands in the perimeter spray 1600, 1620, LS2 is the line spacing of the flood spray pattern 1660, and L is the length of the panel 1400. The spray head advances upward along the vertical axis of the panel 1400 to spray the next band in the flood spray pattern 1660. The spray head moves upward a distance approximately equal to the line spacing, LS2, and sprays a band of paint approximately parallel to the longitudinal axis of the panel 1400 ending at the beginning of the previous band but offset by the line spacing, LS2, above the previous line 1662.

This process repeats until the spray head applies n+1 bands of paint to the surface of the panel 1400, where each band of paint in the flood spray pattern 660 is offset from the previous band of paint by the line spacing, LS2.

In the illustrated embodiment, the width W2 of the paint band in the staggered flood spray 1640 is approximately the same as the width W3 of the paint bands in the flood spray 1660. In other embodiments, the widths W2, W3 are not the same. In some embodiments, the widths W2, W3 are based at least in part on the height Z of the spray head above IC panel 1400. In a preferred embodiment, the staggered flood spray 1640 precedes the flood spray 1660. In other embodiments, the order of the perimeter sprays 1600, 1640, the staggered flood spray 1620, and the flood spray 1660 can vary.

Referring to FIG. 5, in block 1508 the process 12h determines whether the desired paint thickness has been reached. If the desired paint thickness has not been reached, the process returns to block 1500, where blocks 1502-1506 are repeated until the desired paint thickness has been reached. If the desired paint thickness has been reached, the process 12h ends at block 1510.

Figure 17:
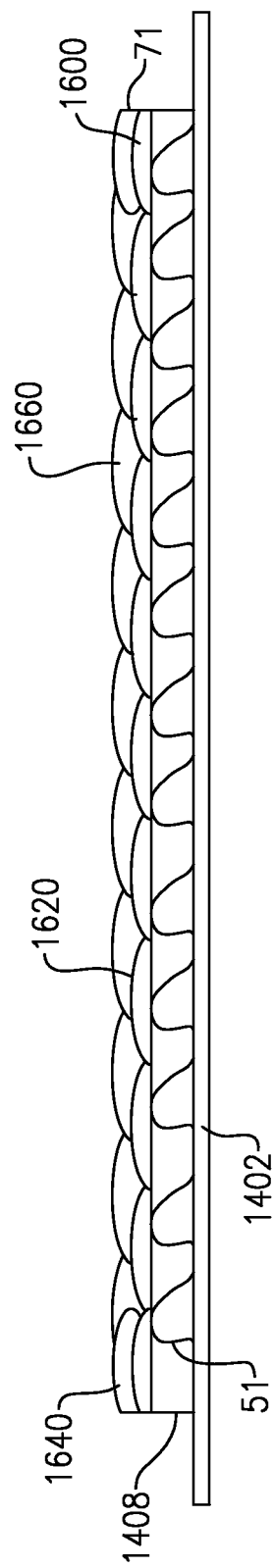
FIG. 17 is a partial cross-sectional view of a panel with modules after the process of FIG. 14, according to certain embodiments.

FIG. 17 is an exemplary cross-sectional view of the panel 1400 after the process of FIG. 15. The panel 1400 comprises the mold cap 1408 encasing the IC modules 1406 and the wirebonds 51 on the substrate 1402. The panel 1400 further comprises the bands of paint from the first perimeter spray 1600, the staggered flood spray 1620, the second perimeter spray 1640, and the flood spray 1660. The bands of perimeter spray pattern 1640 are over the bands of perimeter spray pattern 1600. The perimeter sprays 1600, 1640 provide little or no overspray.

In the embodiment illustrated in FIG. 17, n=9. The 9 bands of the staggered flood spray pattern 1620 are next to the overmold 1408, while the 10 bands of the flood spray pattern 1660 are above the staggered flood spray bands and cover any gaps in created by the irregular metal particles or flakes in the conductive paint. The 9 bands of conductive paint in the staggered flood spray pattern 1620 and the 10 bands of conductive paint in the flood spray pattern 1660 interleave to provide a nearly or approximately or substantially uniform paint thickness over the surface of the caps 1408. The nearly or approximately or substantially uniform paint thickness provides a nearly or approximately uniform conductive layer 71 over the panel 1400.

As illustrated if FIG. 17, the thickness of each of the bands 1600, 1620, 1640, 1660 of conductive paint is greater toward the middle of the band and tapers off toward the sides of the band. As a result, the conductive paint forms a layer on the surfaces 1408 of the panel 1400 that is approximately uniform or approximately flat within a tolerance that accounts for the variations in the thickness of the band of paint. The flatness tolerance is the distance between two parallel planes within which the surface of the layer of conductive paint lies. In an embodiment, the conductive layer 71 has a thickness of approximately 30 microns±15 microns. In another embodiment, the conductive layer 71 has a thickness of approximately 5 microns to approximately 50 microns and a flatness of approximately 5 microns. In other words, the conductive paint layer 71 is between approximately 5 microns and 50 microns thick and the surface of the layer of paint lies within two parallel planes spaced approximately 5 microns apart. More preferably the thickness of the conductive layer 71 is approximately 20 microns to approximately 30 microns with a flatness of approximately 1 micron, and most preferably, the thickness of the conductive layer 71 is approximately 25 microns with a flatness of approximately 0.25 micron. In an embodiment, the flatness of the conductive layer ranges between approximately 0.25 micron and approximately 5 microns. In another embodiment, the flatness is approximately 1% of the thickness of the conductive paint layer 71.

FIG. 18 is an exemplary table showing spray parameters, line parameters, and spray pattern parameters, according to one embodiment. The paint sprayer has a valve pressure of approximately 75 psi, a 21 gauge needle, and an air gap of approximately 22.5°. The paint reservoir is pressurized to approximately 2.5 psi and the air assist is pressurized to approximately 4 psi. In this embodiment, n=9, such that the staggered flood spray pattern 1640 comprises 9 bands of paint and the flood spray pattern comprises 10 bands of paint.

The spray parameters and the line parameters are set for each spray pattern, 1600, 1620, 1640, 1660. Here, the first and the second perimeter spray patterns 1600, 1640 are the same. For each perimeter spray pattern 1600, 1640, the spray speed is approximately 30 inches per second and the spray head is approximately 0.25 inches above the panel 1400. For each perimeter spray pattern 1600, 1640, the paint spray is enabled 10 msec after the spray head begins to travel and is disabled approximately 7.5 msec before the end of the spray head travel. The air assist is enabled 10 msec after the spray head begins to travel and disabled 7.5 msec before the end of the spray head travel. The table further lists the coordinates of the beginning and ending points for the perimeter bands, 1602, 1604, 1606, 1608, 1642, 1644, 1646, 1648. For example, the first perimeter band 602 begins at approximately (0.09, 0.18) and ends at approximately (7.15, 0.18).

For the staggered flood spray pattern 1620, the spray speed is approximately 30 inches per second and the spray head is approximately 0.4 inches above the panel 1400. The paint spray is enabled 5 msec after the spray head begins to travel and is disabled approximately 8 msec before the end of the spray head travel. The air assist is enabled 5 msec after the spray head begins to travel and disabled 8 msec before the end of the spray head travel. The table further lists the coordinates of the beginning and ending points for the 9 staggered flood spray pattern bands. For example, the first staggered flood spray band 1622 begins at approximately (7.1, 0.37) and ends at approximately (0.1, 0.37).

For the flood spray pattern 1660, the spray speed is approximately 30 inches per second and the spray head is approximately 0.4 inches above the panel 1400. The paint spray is enabled 5 msec after the spray head begins to travel and is disabled approximately 8 msec before the end of the spray head travel. The air assist is enabled 5 msec after the spray head begins to travel and disabled 8 msec before the end of the spray head travel. The table further lists the coordinates of the beginning and ending points for the 10 flood spray pattern bands. For example, the first flood spray band 1662 begins at approximately (0.1. 0.275) and ends at approximately (7.1, 0.275).

FIG. 19 is another exemplary table showing spray parameters, line parameters, and spray pattern parameters, according to another embodiment. The paint sprayer has a valve pressure of approximately 75 psi, a 21 gauge needle, and an air gap of approximately 22.5°. The paint reservoir is pressurized to approximately 2 psi and the air assist is pressurized to approximately 3 psi. In this embodiment, n=9, such that the staggered flood spray pattern 640 comprises 9 bands of paint and the flood spray pattern comprises 10 bands of paint.

The spray parameters and the line parameters are set for each spray pattern, 1600, 1620, 1640, 1660. Here, the first and the second perimeter spray patterns 1600, 1640 are the same. For each perimeter spray pattern 1600, 1640, the spray speed is approximately 30 inches per second and the spray head is approximately 0.25 inches above the panel 1400. For each perimeter spray pattern 1600, 1640, the paint spray is enabled approximately 6.37 msec after the spray head begins to travel and is disabled approximately 8.25 msec before the end of the spray head travel. The air assist is enabled approximately 6.37 msec after the spray head begins to travel and disabled approximately 6.25 msec before the end of the spray head travel. The table further lists the coordinates of the beginning and ending points for the perimeter bands, 1602, 1604, 1606, 1608, 1642, 1644, 1646, 1648. For example, the first perimeter band 1602 begins at approximately (0.080, 0.200) and ends at approximately (7.160, 0.200).

For the staggered flood spray pattern 1620, the spray speed is approximately 30 inches per second and the spray head is approximately 0.4 inches above the panel 1400. The paint spray is enabled 5.26 msec after the spray head begins to travel and disabled approximately 10.0 msec before the end of the spray head travel. The air assist is enabled 5.26 msec after the spray head begins to travel and disabled 7 msec before the end of the spray head travel. The table further lists the coordinates of the beginning and ending points for the 9 staggered flood spray pattern bands. For example, the first staggered flood spray band 1622 begins at approximately (7.055, 0.370) and ends at approximately (0.170, 0.370).

For the flood spray pattern 1660, the spray speed is approximately 30 inches per second and the spray head is approximately 0.4 inches above the panel 1400. The paint spray is enabled approximately 5.26 msec after the spray head begins to travel and is disabled approximately 10.0 msec before the end of the spray head travel. The air assist is enabled approximately 5.26 msec after the spray head begins to travel and disabled approximately 7 msec before the end of the spray head travel. The table further lists the coordinates of the beginning and ending points for the 10 flood spray pattern bands. For example, the first flood spray band 1662 begins at approximately (0.170, 0.275) and ends at approximately (7.055, 0.275).

Figure 20:
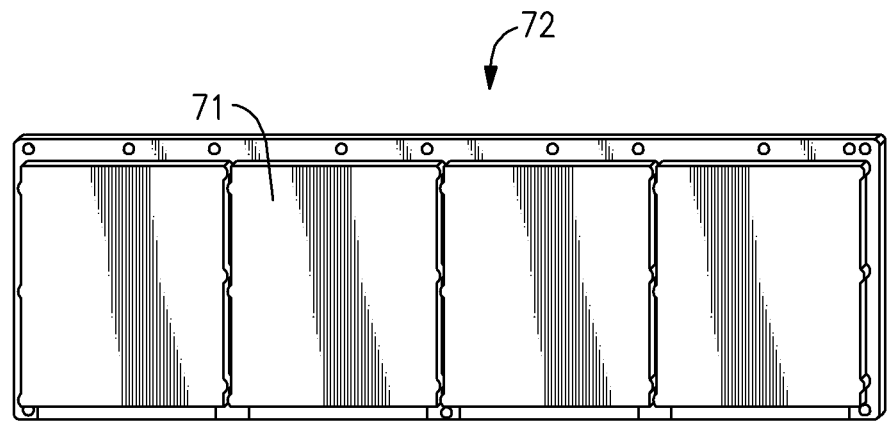
FIG. 20 is an exemplary table showing spray parameters, line parameters, and spray pattern parameters, according to another embodiment.

FIG. 20 shows an example panel 72 that has been sprayed with conductive paint to yield the electrically conductive layer 71 that covers multiple cookie sections. As described in reference to FIG. 14, each cookie section 1404 includes multiple IC modules 1406 that will be separated.

In block 12i of FIG. 2, the modules in a cookie section having a common conductive layer (e.g., a conductive paint layer) can be singulated into individual packaged modules. Such singulation of modules can be achieved in a number of ways, including a sawing technique.

Figure 21:
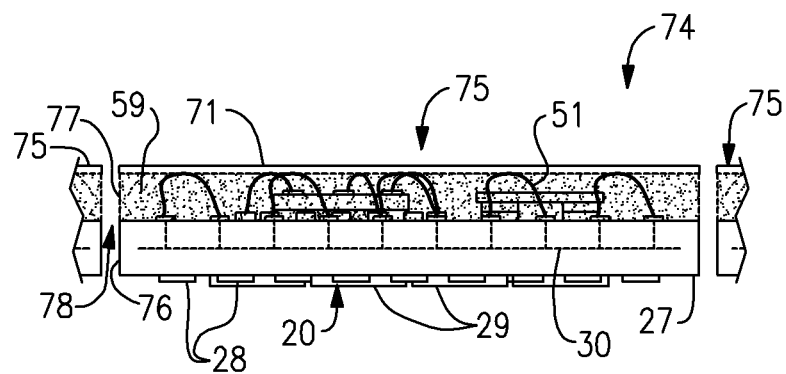
FIG. 21 shows individual packaged modules being cut from the panel.

FIG. 21 shows an example configuration 74 where the modular section described herein has been singulated into a separated module 75. The overmold portion 59 is shown to include a side wall 77; and the module substrate portion 20 is shown to include a side wall 76. Collectively, the side walls 77 and 76 are shown to define a side wall 78 of the separated module 75. The upper portion of the separated module 75 remains covered by the conductive layer 71. The lower surface 27 of the separated module 75 includes contact pads 28, 29 to facilitate electrical connections between the module 75 and a circuit board such as a phone board.

As described herein, such a module includes RF-shielding structures encapsulated within the overmold structure and layered over the overmold structure; and in some implementations, the overall dimensions of the module 75 is not necessarily any larger than a module without the RF-shielding functionality. Accordingly, modules having integrated RF-shielding functionality can advantageously yield a more compact assembled circuit board since external RF-shield structures are not needed. Further, the packaged modular form allows the modules to be handled easier during manipulation and assembly processes.

The singulated modules can be tested for proper functionality and the modular form allows such testing to be performed easier. Further, the module's internal EMI/RFI-shielding functionality allows such testing to be performed without external EMI/RFI-shielding devices.

Figure 22:
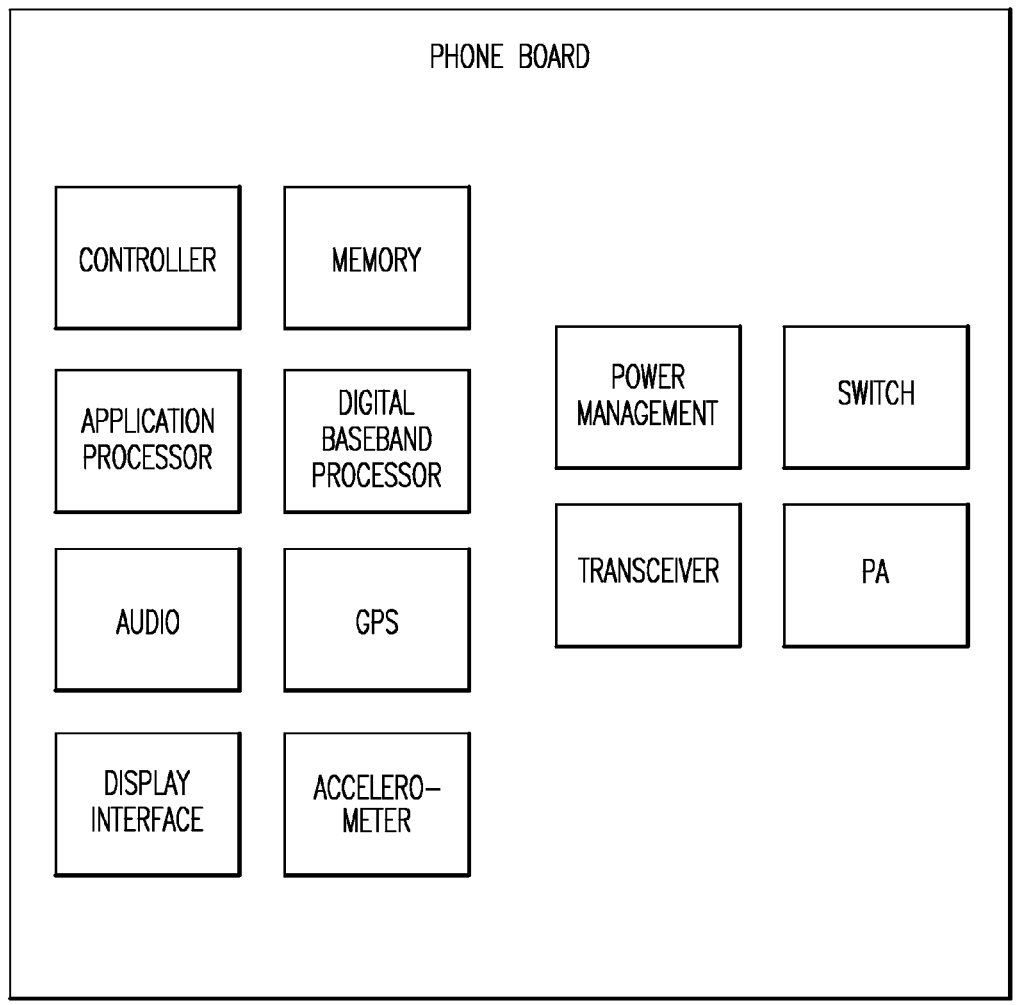
FIG. 22 shows that one or more of modules that are mounted on a wireless phone board can include one or more features as described herein.

FIG. 22 shows that in some embodiments, one or more modules included in a circuit board such as a wireless phone board can be configured with one or more packaging features as described herein. Non-limiting examples of modules that can benefit from such packaging features include, but are not limited to, a controller module, an application processor module, an audio module, a display interface module, a memory module, a digital baseband processor module, GPS module, an accelerometer module, a power management module, a transceiver module, a switching module, and a power amplifier module.

FIG. 23 shows a process 80 that can be implemented to assemble a packaged module having one or more features as described herein on a circuit board. In block 82a, a packaged module can be provided. In some embodiments, the packaged module can represent a module described in reference to FIG. 22. In block 82b, the packaged module can be mounted on a circuit board (e.g., a phone board). FIG. 24 schematically depicts a resulting circuit board 90 having module 91 mounted thereon. The circuit board can also include other features such as a plurality of connections 92 to facilitate operations of various modules mounted thereon.

In block 82c, a circuit board having modules mounted thereon can be installed in a wireless device. FIG. 25 schematically depicts a wireless device 94 (e.g., a cellular phone) having a circuit board 90 (e.g., a phone board). The circuit board 90 is shown to include a module 91 having one or more features as described herein. The wireless device is shown to further include other components, such as an antenna 95, a user interface 96, and a power supply 97.

While embodiments have been described with respect to applying conductive spray paint to a panel of integrated circuit modules, the disclosed systems and methods apply to spray painting any surface with edge control to reduce overspray while maintaining paint thickness uniformity.

The panel 1400 in the illustrated embodiment is a four sided rectangular shape. In other embodiments, the process 12h of FIG. 15 can be adapted for other shapes with more or less than four sides, such as ovals, circles, squares, triangles, trapezoids, and the like.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of certain embodiments is not intended to be exhaustive or to limit the invention to the precise form disclosed above. While specific embodiments of, and examples for, the invention are described above for illustrative purposes, various equivalent modifications are possible within the scope of the invention, as those ordinary skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method to form at least part of an electromagnetic interference or radio frequency interference shield that attenuates electromagnetic interference or radio frequency interference during operation of an integrated circuit module, the method comprising:

forming at least one wirebond around a perimeter of each integrated circuit module of a plurality of integrated circuit modules on a panel;

forming an overmold over the panel such that an upper portion of the at least one wirebond of each integrated circuit module is exposed;

configuring a spray apparatus to automatically spray conductive paint, an automated operation of the spray apparatus being based at least in part on physical properties of the conductive paint and a size of the panel;

automatically spraying a plurality of separate perimeter bands of the conductive paint onto a perimeter of the panel such that the perimeter bands do not overlap and so an entire width of each of the separate bands is sprayed inward of an outer perimeter edge of the panel to avoid overspray;

automatically spraying N axially elongate first bands of the conductive paint on an upper surface of the panel inward of the perimeter bands and along a longitudinal axis of the panel and automatically advancing along a vertical axis of the panel a first distance after spraying each first band of the conductive paint until the Nth axially elongate first band is reached;

automatically spraying N+1 axially elongate second bands of the conductive paint , after spraying the N axially elongate first bands, inward of the perimeter bands along the longitudinal axis of the panel such that the N+1 axially elongate second bands interleave the N axially elongate first bands to provide an approximately uniform layer of the conductive paint over the upper surface of the panel while at the same time avoiding overspray, the layer of the conductive paint electrically coupling with the wirebonds on the panel to form at least part of an electromagnetic interference or radio frequency interference shield that attenuates electromagnetic interference or radio frequency interference during operation of at least one integrated circuit module of the plurality of integrated circuit modules; and automatically spraying a second plurality of separate perimeter bands of the conductive paint onto the perimeter of the panel after automatically spraying the N axially elongate fist bands and before automatically spraying the N+1 axially elongate second bands such that the second plurality of separate perimeter bands do not overlap and so an entire width of each of the second plurality of separate perimeter bands is sprayed inward of an outer perimeter edge of the panel to avoid overspray.

2. The method of claim 1 wherein a thickness of the layer of the conductive paint is approximately 30 microns ± approximately 15 microns.

3. The method of claim 1 wherein a flatness of the layer of conductive paint ranges between approximately 0.25 micron and approximately 5 microns.

4. The method of claim 1 wherein the plurality of separate perimeter bands and the second plurality of separate perimeter bands define a layer of conductive paint over the perimeter of the panel, the layer of conductive paint over the upper surface of the panel is in electrical contact with the layer of conductive paint over the perimeter of the panel, both layers forming the at least part of the electromagnetic interference or radio frequency interference shield that attenuates the electromagnetic interference or radio frequency interference during operation of the at least one integrated circuit module.

5. The method of claim 1 wherein the electromagnetic interference or radio frequency interference shield includes the layer of the conductive paint in electrical contact with a plurality of wirebonds encircling the at least one integrated circuit module.

6. The method of claim 1 further comprising controlling parameters of the spray apparatus, the parameters including at least one of a valve pressure, a needle size, an air cap, a fluid pressure, an air assist pressure, a fluid on time, a fluid off time, an air assist on time, an air assist off time, a height of a nozzle above the upper surface, a travel speed of the nozzle, and an initial position of the nozzle.

7. The method of claim 1 wherein metal particles included in the conductive paint include metal flakes having an irregular shape and the second bands of the conductive paint being interspersed with the first bands of the conductive paint to approximately cover the upper surface of the panel with the metal flakes.

8. The method of claim 1 wherein N+1 is determined by rounding up a height of the panel minus twice a width of the perimeter band of the conductive paint divided by a width of the second band of the conductive paint to an integer value.

9. The method of claim 1 wherein the wirebonds electrically couple to a ground plane to form an interconnected shielded volume that attenuates the electromagnetic interference or radio frequency interference during operation of the at least one integrated circuit module.

10. A method to provide at least part of an electromagnetic interference or radio frequency interference shield that attenuates electromagnetic interference or radio frequency interference during operation of an integrated circuit module, the method comprising:

forming at least one wirebond around a perimeter of each integrated circuit module of a plurality of integrated circuit modules formed on a panel;

forming an overmold over the panel such that an upper portion of the at least one wirebond of each integrated circuit module is exposed;

controlling a first set of parameters of a spray apparatus based at least in part on viscosity of a conductive paint and a size of metal particles in the conductive paint;

determining a second set of parameters, the second set of parameters based at least in part on at least one of the first set of parameters;

automatically spraying a plurality of separate perimeter bands of the conductive paint onto a perimeter of the panel such that the perimeter bands do not overlap and so an entire width of each of the separate bands is sprayed inward of an outer perimeter edge of the panel to avoid overspray;

automatically spraying the conductive paint from the spray nozzle to form N axially elongate first bands of the conductive paint and N+1 axially elongate second bands of the conductive paint along a longitudinal axis of the panel, the N axially elongate first bands separated by a first distance from one another and the N+1 axially elongate second bands separated by a second distance from one another, the N axially elongate first bands and N+1 axially elongate second bands being sprayed inward of the plurality of separate perimeter bands to avoid overlap with the previously sprayed perimeter bands, the N+1 axially elongate second bands being sprayed after spraying the N axially elongate first bands and such that the N+1 axially elongate second bands interleave the N axially elongate first bands to provide an approximately uniform layer of the conductive paint over at least a portion of the upper surface of the panel while at the same time avoiding overspray, the layer of the conductive paint electrically coupling with the at least one wirebond of at least one integrated circuit module of the plurality of integrated circuit modules to form at least part of an electromagnetic interference or radio frequency interference shield; and automatically spraying a second plurality of separate perimeter bands of the conductive paint onto the perimeter of the panel after automatically spraying the N axially elongate fist bands and before automatically spraying the N+1 axially elongate second bands such that the second plurality of separate perimeter bands do not overlap and so an entire width of each of the second plurality of separate perimeter bands is sprayed inward of an outer perimeter edge of the panel to avoid overspray.

11. The method of claim 10 wherein a thickness of the layer of the conductive paint is approximately 30 microns ± approximately 15 microns.

12. The method of claim 10 wherein a flatness of the layer of the conductive paint ranges between approximately 0.25 micron and approximately 5 microns.

13. The method of claim 10 wherein the plurality of separate perimeter bands and the second plurality of separate perimeter bands define a layer of conductive paint over the perimeter of the panel, the layer of the conductive paint over the upper surface of the panel is in electrical contact with the layer of conductive paint over the perimeter of the panel, both layers forming at least part of the electromagnetic interference or radio frequency interference shield.

14. The method of claim 10 wherein the electromagnetic interference or radio frequency interference shield includes the layer of the conductive paint in electrical contact with a plurality of wirebonds encircling the at least one integrated circuit module.

15. The method of claim 10 wherein the metal particles include metal flakes having an irregular shape.

16. The method of claim 10 wherein N+1 is determined by rounding up a height of the panel minus twice a width of the perimeter band of the conductive paint divided by a width of the second band of the conductive paint to an integer value.

17. The method of claim 10 wherein the wirebonds electrically couple to a ground plane to form an interconnected shielded volume.

* * * * *

UNITED STATES PATENT AND TRADEMARK OFFICE
CERTIFICATE OF CORRECTION

PATENT NO. : 9,754,896 B2  
APPLICATION NO. : 13/893605  
DATED : September 5, 2017  
INVENTOR(S) : Matthew Sean Read Page 1 of 1

It is certified that error appears in the above-identified patent and that said Letters Patent is hereby corrected as shown below:

Column 19 Line 8, Claim 1, change "fist" to --first--.

Column 20 Line 42, Claim 10, change "fist" to --first--.

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*